United States Patent
Li

(10) Patent No.: US 12,174,403 B2
(45) Date of Patent: Dec. 24, 2024

(54) MANUFACTURING METHOD FOR DIFFRACTION GRATING WAVEGUIDE OF NEAR-EYE DISPLAY

(71) Applicant: National Center for Nanoscience and Technology, China, Beijing (CN)

(72) Inventor: Xiaojun Li, Beijing (CN)

(73) Assignee: NATIONAL CENTER FOR NANOSCIENCE AND TECHNOLOGY, Beijing (CN)

(*) Notice: Subject to any disclaimer, the term of this patent is extended or adjusted under 35 U.S.C. 154(b) by 257 days.

(21) Appl. No.: 17/631,470

(22) PCT Filed: Aug. 28, 2019

(86) PCT No.: PCT/CN2019/103035
§ 371 (c)(1),
(2) Date: Jan. 29, 2022

(87) PCT Pub. No.: WO2021/017077
PCT Pub. Date: Feb. 4, 2021

(65) Prior Publication Data
US 2022/0276419 A1  Sep. 1, 2022

(30) Foreign Application Priority Data

Aug. 1, 2019 (CN) .......................... 201910707421.0

(51) Int. Cl.
*G02B 5/18* (2006.01)
*B29C 33/38* (2006.01)
*G03F 7/00* (2006.01)

(52) U.S. Cl.
CPC ........ *G02B 5/1857* (2013.01); *B29C 33/3842* (2013.01); *G03F 7/0002* (2013.01); *G03F 7/0005* (2013.01)

(58) Field of Classification Search
CPC ... G03F 7/0002; G03F 7/0005; G02B 5/1857; B29C 33/3842
See application file for complete search history.

(56) References Cited

U.S. PATENT DOCUMENTS 10,809,448 B1 * 10/2020 Calafiore .............. G03F 7/0002
10,996,382 B1 *  5/2021 Calafiore .............. G03F 7/2022
(Continued)

FOREIGN PATENT DOCUMENTS

CN     101852877 A    10/2010
CN     101971092 A     2/2011
(Continued)

OTHER PUBLICATIONS

Fu, Xinxin, "Study on the Process and Templates' Fabrication of Nano-imprint Lithography", Chinese Master's Theses Full-Text Database, Engineering Technology I, No. 3, Mar. 15, 2016, ISSN: 1674-0246, pp. 3-5.
(Continued)

*Primary Examiner* — S. Behrooz Ghorishi
*Assistant Examiner* — Alexander A Wang
(74) *Attorney, Agent, or Firm* — Samson G. Yu

(57) ABSTRACT

Some embodiments of the present disclosure relate to a manufacturing method using nano-imprint lithography for a diffraction grating waveguide of a near-eye display. The manufacturing method includes: manufacturing an imprint lithography template with a diffraction grating waveguide pattern; transferring the diffraction grating waveguide pattern of the imprint lithography template to a transferring template by nano-imprint lithography, so as to obtain a transferring template with a reverse pattern of the diffraction grating waveguide pattern; and transferring the reverse pattern of the diffraction grating waveguide pattern of the transferring template to a waveguide substrate by nano-
(Continued)

imprint lithography, so as to obtain the diffraction grating waveguide of the near-eye display.

13 Claims, 3 Drawing Sheets

(56) References Cited

U.S. PATENT DOCUMENTS

| | | | |
|---|---|---|---|
| 2006/0279025 A1* | 12/2006 | Heidari | G03F 7/0002 |
| | | | 264/320 |
| 2008/0248334 A1* | 10/2008 | Moriwaki | B82Y 40/00 |
| | | | 264/293 |
| 2016/0282526 A1* | 9/2016 | Aono | G02B 5/1857 |
| 2017/0348943 A1* | 12/2017 | Kajiya | B29D 11/00788 |
| 2019/0263023 A1* | 8/2019 | Berg | B29C 33/3842 |

FOREIGN PATENT DOCUMENTS

| | | |
|---|---|---|
| CN | 102910579 A | 2/2013 |
| CN | 103328176 A | 9/2013 |
| CN | 103576446 A | 2/2014 |
| CN | 105824190 A | 8/2016 |
| CN | 109143434 A | 1/2019 |
| CN | 111033326 A | 4/2020 |
| JP | 2009020503 A | 1/2009 |
| WO | 2015116974 A1 | 10/2010 |
| WO | 20190035579 A1 | 2/2019 |

OTHER PUBLICATIONS

JP First Office Action issued on Feb. 14, 2023.

* cited by examiner

MANUFACTURING METHOD FOR DIFFRACTION GRATING WAVEGUIDE OF NEAR-EYE DISPLAY

CROSS-REFERENCE TO RELATED APPLICATIONS

The present disclosure is a national stage application of International Patent Application No. PCT/CN2019/103035, which is filed on Aug. 28, 2019, and claims priority to Chinese Patent Application No. 201910707421.0, filed on Aug. 1, 2019 and entitled "Manufacturing Method for Diffraction Grating Waveguide of Near-eye Display", the contents of which are hereby incorporated by reference in its entirety.

TECHNICAL FIELD

The disclosure relates to a near-eye display technology, in particular to a manufacturing method using nano-imprint lithography for a diffraction grating waveguide of a near-eye display.

BACKGROUND

As an innovation of visual experience and human-computer interaction, augmented reality (AR) provides a new technology for integrating real world information and virtual world information seamlessly.

A near-eye display is a critical member of augmented reality, and mainly has three modes, that is, a prism, a free-form surface and a diffraction grating waveguide. With an extremely small field angle and a large thickness, a prism cannot meet the requirements of large-scale industrialization. Despite a relatively large field angle, the free-form surface is awfully difficult to process and design and large-sized, and therefore is far from being lightweight and portable. As for a diffraction grating waveguide lens display technology, light is incident, refracted and emergent under a diffraction effect of a grating, and is transmitted according to a total reflection principle, so as to transmit an image of a microdisplay to a human eye and to enable a virtual image to be seen. Since a total reflection principle of a diffraction grating waveguide display technology is the same as a total reflection principle of an optical fiber technology, a diffraction grating waveguide display member can be manufactured as thin and transparent as an ordinary glasses lens, but has a wider display area and a large field angle, and can be integrated, miniaturized and lightweight, thereby having wide application prospects.

Traditional grating processing methods mainly include a mechanical scribing method, a holographic interference exposure method, a laser direct writing method, a focused ion beam processing method and an electron beam exposure method. The mechanical scribing method is mainly used to manufacture a grating on a metal substrate by a diamond cutter, but a manufactured grating has a large period, so it is difficult to manufacture a grating with a submicron period, and a manufactured grating has large roughness, so a ghost line is prone to generation, and the grating cannot be manufactured on a glass substrate required for near-eye display. The holographic interference exposure method can manufacture gratings in a large area on the glass substrate, but has poor repeatability and low efficiency. The laser direct writing method, the focused ion beam processing method and the electron beam exposure method have high processing precision, can directly process a grating on a nanometer scale without a mask, but cannot process diffraction gratings in batches and in a large area, and have low efficiency and high price.

SUMMARY

In view of the above analysis, the present disclosure aims to provide a manufacturing method using nano-imprint lithography for a diffraction grating waveguide of a near-eye display, and solves the problems of high manufacturing difficulty, low yield, poor repeatability and incapacity of large-scale production of diffraction grating waveguides in the art known to inventors.

The objective of the disclosure is achieved through the following technical solution:

Some embodiments of the present disclosure provide the manufacturing method using nano-imprint lithography for a diffraction grating waveguide of a near-eye display. The method includes:

step 1: manufacturing an imprint lithography template with a diffraction grating waveguide pattern;

step 2: transferring the diffraction grating waveguide pattern of the imprint lithography template to a transferring template by nano-imprint lithography, so as to obtain a transferring template with a reverse pattern of the diffraction grating waveguide pattern; and step 3: transferring the reverse pattern of the diffraction grating waveguide pattern of the transferring template to a waveguide substrate by nano-imprint lithography, so as to obtain the diffraction grating waveguide of the near-eye display.

In some embodiments, the step 1 includes: providing an imprint lithography substrate, and uniformly spin-coating the imprint lithography substrate with a photoresist; baking to remove a photoresist solvent in the photoresist, and exposing a photoresist layer by an exposure process until a surface of the imprint lithography substrate is exposed, so as to form the diffraction grating waveguide pattern on the photoresist layer after development; etching the exposed imprint lithography substrate after being exposed by an etching process, transferring the diffraction grating waveguide pattern from the photoresist layer to the imprint lithography substrate, so as to form the diffraction grating waveguide pattern on the imprint lithography substrate; and removing the photoresist layer to obtain the imprint lithography template with the diffraction grating waveguide pattern.

In some embodiments, in step 2, nano-imprint lithography is hot imprint lithography or ultraviolet imprint lithography.

In some embodiments, the step of transferring the diffraction grating waveguide pattern of the imprint lithography template to the transferring template by hot imprint lithography includes: placing a flexible substrate on a surface, with the diffraction grating waveguide pattern, of the imprint lithography template; heating the flexible substrate to a glass transition temperature or above; applying a pressure to soften the flexible substrate and fill the diffraction grating waveguide pattern of the imprint lithography template with the flexible substrate; and carrying out cooling and demolding to obtain the transferring template with a reverse pattern of a diffraction grating waveguide pattern.

In some embodiments, the step of transferring the diffraction grating waveguide pattern of the imprint lithography template to the transferring template by ultraviolet imprint lithography includes: providing a transparent flexible substrate; spin-coating with an ultraviolet sensitive glue on a side, facing the imprint lithography template, of the transparent flexible substrate; attaching the transparent flexible substrate to the imprint lithography template; applying a pressure to fill the diffraction grating waveguide pattern of the imprint lithography template with the ultraviolet sensitive glue; and curing the ultraviolet sensitive glue and demolding to obtain the transferring template with the reverse pattern of the diffraction grating waveguide pattern.

In some embodiments, in step 3, nano-imprint lithography is hot imprint lithography or ultraviolet imprint lithography.

In some embodiments, the step of transferring the reverse pattern of the diffraction grating waveguide pattern of the transferring template to a waveguide substrate by ultraviolet imprint lithography includes: providing the waveguide substrate; spin-coating with an ultraviolet imprint lithography glue on a side, facing the transferring template, of the waveguide substrate; covering the transferring template on the waveguide substrate coated with the ultraviolet imprint lithography glue; filling the ultraviolet imprint lithography glue in the reverse pattern of the diffraction grating waveguide pattern of the transferring template by pneumatic uniform pressurization or rolling pressurization; and curing the ultraviolet imprint lithography glue and demolding to obtain the diffraction grating waveguide of the near-eye display.

In some embodiments, step 3 further includes: after curing and demolding, transferring, by an etching process, the diffraction grating waveguide pattern on the ultraviolet imprint lithography glue to the waveguide substrate, so as to remove the ultraviolet imprint lithography glue.

In some embodiments, the transferring template is a flexible template, and the waveguide substrate is a curved substrate.

In some embodiments, in the step 3, the waveguide substrate is a transparent polymer substrate. Moreover, the step 3 includes: transferring, by electroforming, the reverse pattern of the diffraction grating waveguide pattern on the transferring template to a nickel sheet; placing the electroformed nickel sheet after being electroformed on the transparent polymer substrate; enabling the transparent polymer substrate to enter the diffraction grating waveguide pattern of the nickel sheet by hot imprint lithography; and carrying out cooling and demolding to obtain the diffraction grating waveguide of the near-eye display.

Compared with the art known to inventors, the disclosure at least realizes one of the following beneficial effects:
  a) The manufacturing method for the diffraction grating waveguide of the near-eye display provided in the disclosure uses nano-imprint lithography (hot imprint lithography, ultraviolet imprint lithography or radial imprint lithography). Nano-imprint lithography is a technology of using an imprint lithography template to obtain a pattern on a substrate with a resist by hot imprint lithography or ultraviolet imprint lithography, and has advantages of high processing precision, good repeatability, low cost, large scale, high stability, etc. The manufactured diffraction grating waveguide of the near-eye display has excellent performances, meets requirements of near-eye display lenses in the field of augmented reality (AR) which is increasingly mature and rapidly developed, is applied to the fields of military industry, police, industry, medical treatment, education, entertainment, tourism, etc., and has broad market prospects.
  b) According to the manufacturing method for the diffraction grating waveguide of the near-eye display provided in the disclosure, since the imprint lithography template is complex to manufacture and has an increased price, the imprint lithography template is used to obtain the transferring template (a corresponding quartz template or a flexible polymer template) by a transferring manner, such that the imprint lithography template is prevented from being directly used for imprint lithography of the near-eye display. Moreover, a plurality of transferring templates are manufactured by the same imprint lithography template, such that service life of the imprint lithography template is prolonged, and cost is reduced.

Other features and advantages of the disclosure will be illustrated in the subsequent description, and partially are obvious in the description, or is known by implementing the disclosure. The objective and the other advantages of the disclosure are realized and attained by the structure particularly pointed out in the written description and the accompanying drawings.

BRIEF DESCRIPTION OF THE DRAWINGS

The accompanying drawings are only used for the objective of illustrating specific embodiments, and are not to be regarded as limiting the disclosure, and the same reference mark represents the same component throughout the accompanying drawings.

DETAILED DESCRIPTION OF THE EMBODIMENTS

Figure 1:
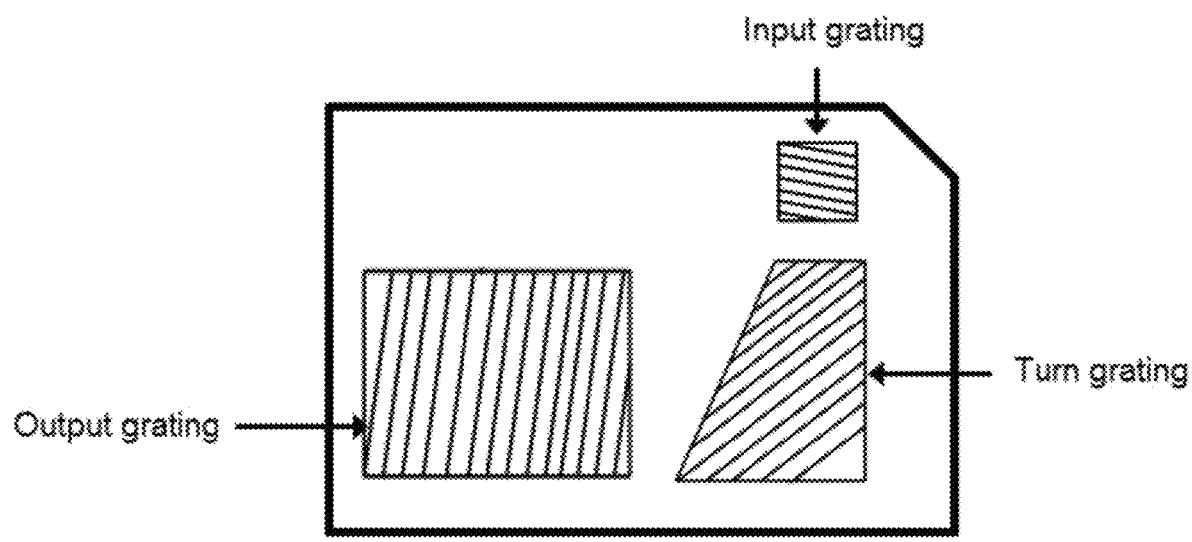
FIG. 1 illustrates a grating distribution diagram of a diffraction grating waveguide.

Preferred embodiments of the disclosure will be described in detail below with reference to the accompanying drawings, where the accompanying drawings form a part of the disclosure, and serve, together with the embodiments, to explain the principles of the disclosure.

In order to better understand a diffraction grating waveguide, the diffraction grating waveguide is described below. A diffraction grating waveguide of a near-eye display mainly includes an input grating and an output grating, and some diffraction grating waveguide of a near-eye display also include a turn grating, with reference to FIG. 1. A diffraction grating waveguide pattern has corresponding grating structures (an input grating and an output grating, or an input grating, an output grating and a turn grating) of the diffraction grating waveguide.

Some embodiments of the disclosure provide a manufacturing method for a diffraction grating waveguide of a near-eye display. With reference to FIGS. 1-8, the method includes:

step 1, manufacture an imprint lithography template with a diffraction grating waveguide pattern. It should be noted that the imprint lithography template is on a nanometer scale, that is, the imprint lithography template is a nano-imprint lithography template.

Step 2: transfer the diffraction grating waveguide pattern of the imprint lithography template to a transferring template by nano-imprint lithography, so as to obtain a transferring template with a reverse pattern of a diffraction grating waveguide pattern.

Step 3: transfer the reverse pattern of the diffraction grating waveguide pattern of the transferring template to a waveguide substrate by nano-imprint lithography, so as to obtain the diffraction grating waveguide of the near-eye display.

Compared with the art known to inventors, the manufacturing method for a diffraction grating waveguide of a near-eye display provided in the disclosure uses nano-imprint lithography (hot imprint lithography, ultraviolet imprint lithography or radial imprint lithography). Nano-imprint lithography is a technology of using an imprint lithography template to obtain a pattern on a substrate with a resist by hot imprint lithography or ultraviolet imprint lithography, and has advantages of high processing precision, good repeatability, low cost, large scale, high stability, etc. The manufactured diffraction grating waveguide of the near-eye display has excellent performances, meets requirements of near-eye display lenses in the field of augmented reality (AR) which is increasingly mature and rapidly developed, is applied to the fields of military industry, police, industry, medical treatment, education, entertainment, tourism, etc., and has broad market prospects.

In addition, since the imprint lithography template is complex to manufacture and has an increased price, the imprint lithography template is used to obtain a transferring template (a corresponding quartz template or a flexible polymer template) by a transferring manner, such that the imprint lithography template is prevented from being directly used for imprint lithography of a near-eye display. Moreover, a plurality of transferring templates are manufactured by the same imprint lithography template, such that service life of the imprint lithography template is prolonged, and cost is reduced.

Figure 2:
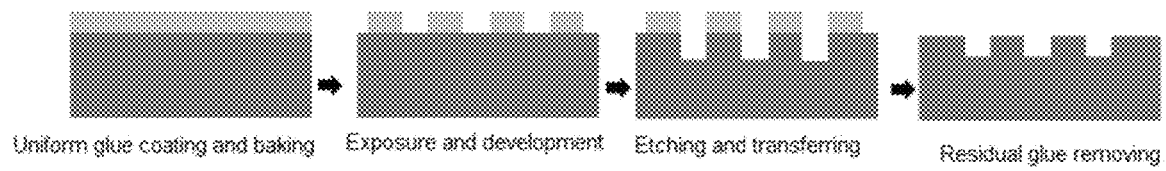
FIG. 2 illustrates a flow diagram for manufacturing an imprint lithography template in a manufacturing method for a diffraction grating waveguide of a near-eye display of some embodiments of the present disclosure.

In step 1, the step of manufacturing an imprint lithography template with a diffraction grating waveguide pattern include: provide an imprint lithography substrate, and uniformly spin-coat the imprint lithography substrate with a photoresist, such as a polymethylmethacrylate (PMMA) photoresist or a ZEP520 photoresist; bake to remove a photoresist solvent in the photoresist, and expose a photoresist layer by an exposure process until a surface of the imprint lithography substrate is exposed, so as to form the diffraction grating waveguide pattern on the photoresist layer after development; etch the exposed imprint lithography substrate after being exposed by an etching process, and transfer the diffraction grating waveguide pattern from the photoresist layer to the imprint lithography substrate, so as to form the diffraction grating waveguide pattern on the imprint lithography substrate; and remove the photoresist layer to obtain the imprint lithography template with the diffraction grating waveguide pattern, with reference to FIG. 2.

The exposure process is an electron beam exposure method, a laser direct writing method or a holographic exposure method, etc. In order to improve efficiency and reduce cost, the imprint lithography template is also manufactured by combining the above processes. For example, considering that laser direct writing or holographic exposure has high production efficiency, but is only suitable for producing large-size gratings, laser direct writing or holographic exposure is used to manufacture the imprint lithography template in the case that the diffraction grating waveguide pattern has a period of 500 nm or above. In the case that the diffraction grating waveguide pattern has a period of less than 500 nm, electron beam exposure which has low production efficiency but is suitable for producing small-size gratings are selected.

For example, when electron beam exposure is used for exposure and development, a specific process is as follows: provide the imprint lithography substrate, clean a silicon wafer through a RCA standard cleaning method, and bake a cleaned imprint lithography substrate at 100-115° C. for 1-3 min; spin-coat a baked imprint lithography substrate with the photoresist, where a ZEP520 exposure glue with corrosion resistance and high resolution is selected, and a spin-coating thickness is 145-153 nm; bake at 175-182° C. for 1-2 min to remove the photoresist solvent in the photoresist layer; expose the photoresist layer by an electron beam direct writing exposure machine, so as to write the diffraction grating waveguide pattern shown in FIG. 1, where an exposure dose is 286-310 $\mu C/cm^2$, an electron beam has a beam spot diameter of 0.8-1.2 nm, a beam current is 18-21 nA; develop an exposed substrate for 1.3-1.8 min by a n-amyl acetate solution with a butanone volume percentage of 1.5%, and then carry out fixation for 1.4-1.7 min with isopropanol; and dry the substrate with nitrogen gas, so as to form the diffraction grating waveguide pattern on the photoresist layer after development, where the input grating has a period of 200-280 nm, the turn grating has a period of 220-246 nm, and the output grating has a period of 236-260 nm.

In order to improve manufacturing adaptability of the above imprint lithography template, the imprint lithography template (that is, the imprint lithography substrate) is made of a silicon material such as monocrystalline silicon, quartz or glass. Silicon serves as a substrate material of the imprint lithography template because a silicon substrate is a common material in the above several imprint lithography template processing technologies, has strong adaptability, and is conveniently processed by a combination of the above several processing technologies.

It should be noted that in general, the input grating, a refraction grating and the output grating of the diffraction grating waveguide are all two-dimensional rectangular gratings, but sometimes, in order to meet better visual experience, the input grating also is a blazed grating or an inclined grating.

Illustratively, when the input grating in the diffraction grating waveguide is a two-dimensional rectangular grating or an inclined grating, and the refraction grating and the output grating are two-dimensional rectangular gratings, inductively coupled plasma etching is used for etching, where specific etching conditions are as follows: a substrate temperature is 0-2° C., inductively coupled plasma (ICP) has maximum power of 130-155 W and minimum power radio frequency (RF) of 18-23 W, a pressure is 0.9-1.2 Pa, SF6 flow is 26-33 sccm, $O_2$ flow is 4-7 sccm, Ar flow is 6-9 sccm, and etching time is 12-17 s. An etched substrate is subjected to butanone ultrasonic treatment for 8-10 min to remove a ZEP520 residual glue, so as to obtain the imprint lithography template with the diffraction grating waveguide pattern.

When the input grating in the diffraction grating waveguide is a blazed grating, and the refraction grating and the output grating are two-dimensional rectangular gratings, the blazed grating is obtained by ion beam etching, and then the two-dimensional rectangular grating or the inclined grating is obtained by inductively coupled plasma etching, so as to obtain the imprint lithography template with the diffraction grating waveguide pattern. Ion beam etching conditions are as follows: the exposed substrate is spin-coated with a 212-230 nm of ZAP520A exposure glue layer, the baking temperature is 175-186° C., the baking time is 1.5-2 min, the exposed glue layer with a period of 220-239 nm and a blazed grating pattern is obtained by development after exposure, ion beam etching is carried out, the ion beam current is 30-35 mA, oxygen flow is 28-33 sccm, ion beam energy is 580-623 eV, an ion beam etching inclination angle is 40-42 degrees, the etching time is 2.5-3.0 h, and the residual exposure glue layer is removed after etching, so as to obtain the imprint lithography template with the diffraction grating waveguide pattern.

In order to reduce surface energy of the imprint lithography template and facilitate demolding in subsequent imprint lithography, step 1 needs to further include: carry out passivation on the imprint lithography template with the diffraction grating waveguide pattern, where passivation includes: clean the imprint lithography template, heat a cleaned imprint lithography template at 78-85° C. for 8-11 mm, then put a silicon template in a vacuum dryer, drop 50 µL of perfluorooctylsilane on a glass slide beside the silicon template, then vacuum to 30 Pa, maintain the pressure for 5 h, and then take out a passivated silicon template.

Illustratively, in step 2, the above transferring template is a quartz template or a flexible template, and in order to obtain diffraction grating waveguides of near-eye displays with different curved curvatures, the above transferring template is a flexible template, such as a polyethylene terephthalate (PET) template, a polydimethylsiloxane (PDMS) template or a fluoroplastic template. The soft template is used for imprint lithography on a flat substrate or a curved surface, so as to obtain the near-eye displays with different curved curvatures. A diffraction grating waveguide lens conforming to the ergonomics is obtained more easily.

For step 2, the diffraction grating waveguide pattern of the imprint lithography template is transferred to the transferring template by hot imprint lithography or ultraviolet imprint lithography.

Figure 3:
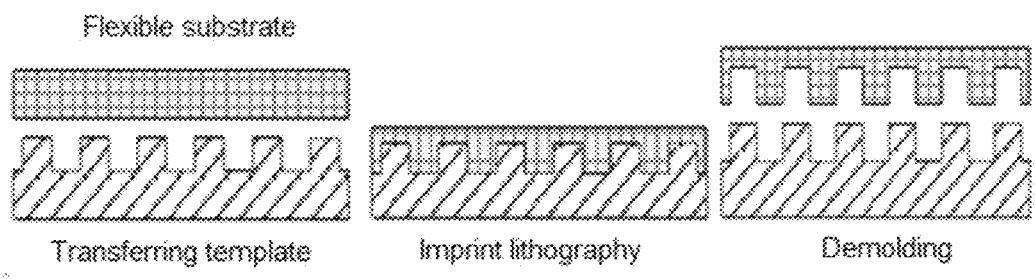
FIG. 3 illustrates a flow diagram for manufacturing a transferring template in the manufacturing method for a diffraction grating waveguide of a near-eye display of some embodiments of the present disclosure.

The step of transferring the diffraction grating waveguide pattern of the imprint lithography template to a transferring template by the hot imprint lithography includes: place a flexible substrate (such as a thermoplastic polymer substrate) on a surface, with the diffraction grating waveguide pattern of the imprint lithography template; heat the flexible substrate to a glass transition temperature or above; apply a pressure to soften the flexible substrate to fill the diffraction grating waveguide pattern of the imprint lithography template with the flexible substrate; and carry out cooling and demolding to obtain the transferring template with the reverse pattern of the diffraction grating waveguide pattern, with reference to FIG. 3.

Illustratively, a fluorinated resin substrate is placed on the imprint lithography template, heating is carried out to 90-98° C., a pressure of 26-33 bar is applied, the pressure is maintained for 12-19 mm, and then demolding is carried out to obtain the corresponding transferring template.

The step of transferring the diffraction grating waveguide pattern of the imprint lithography template to a transferring template by ultraviolet imprint lithography includes: provide a transparent flexible substrate; spin-coat with an ultraviolet sensitive glue on a side, facing the imprint lithography template, of the transparent flexible substrate; attach the transparent flexible substrate to the imprint lithography template; apply a pressure to fill the diffraction grating waveguide pattern of the imprint lithography template with the ultraviolet sensitive glue; and cure the ultraviolet sensitive glue and demold to obtain the transferring template with the reverse pattern of the diffraction grating waveguide pattern.

Similarly, for step 3, the reverse pattern of the diffraction grating waveguide pattern of the transferring template is transferred to the waveguide substrate by hot imprint lithography or ultraviolet imprint lithography. It should be noted that compared with the hot imprint lithography, the ultraviolet imprint lithography applies a less pressure, and has a fast copying speed, and roll-plate imprint lithography is used to produce the diffraction grating waveguides of the near-eye displays in batches, and rapidly copy the gratings in a large area.

Figure 4:
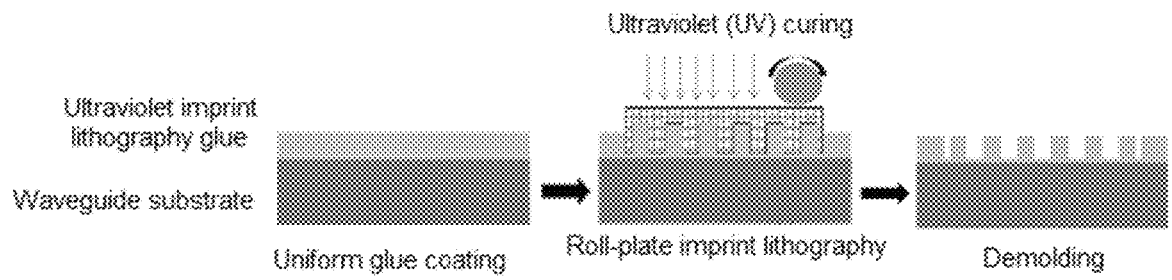
FIG. 4 illustrates a flow diagram for manufacturing a diffraction grating waveguide on the basis of nano-imprint lithography in the manufacturing method for a diffraction grating waveguide of a near-eye display of some embodiments of the present disclosure.

The step of transferring the reverse pattern of the diffraction grating waveguide pattern of the transferring template to a waveguide substrate by the ultraviolet imprint lithography includes: provide the waveguide substrate; spin-coat with an ultraviolet imprint lithography glue on a side, facing the transferring template, of the waveguide substrate; cover with the transferring template on the waveguide substrate coated with the ultraviolet imprint lithography glue; fill the ultraviolet imprint lithography glue in the reverse pattern of the diffraction grating waveguide pattern of the transferring template by pneumatic uniform pressurization or rolling pressurization; and cure the ultraviolet sensitive glue and demold to obtain the diffraction grating waveguide of the near-eye display, with reference to FIG. 4.

Specific imprint lithography process and parameters are as follows: a cleaned waveguide substrate (such as a glass sheet) is spin-coated with an ultraviolet imprint lithography glue, the ultraviolet imprint lithography glue has a thickness of 1.2-1.6 µm, the waveguide substrate with a uniform glue is covered with the transferring template, a pressure is applied by roll printing, the pressure is 0.6-0.9 MPa, the ultraviolet imprint lithography glue is cured by ultraviolet (UV) irradiation after the reverse pattern of the diffraction grating waveguide pattern of the transferring template is filled with the ultraviolet imprint lithography glue, UV curing time is 22-28 s, and after curing, demolding is carried out to obtain the diffraction grating waveguide of the near-eye display.

Figure 5:
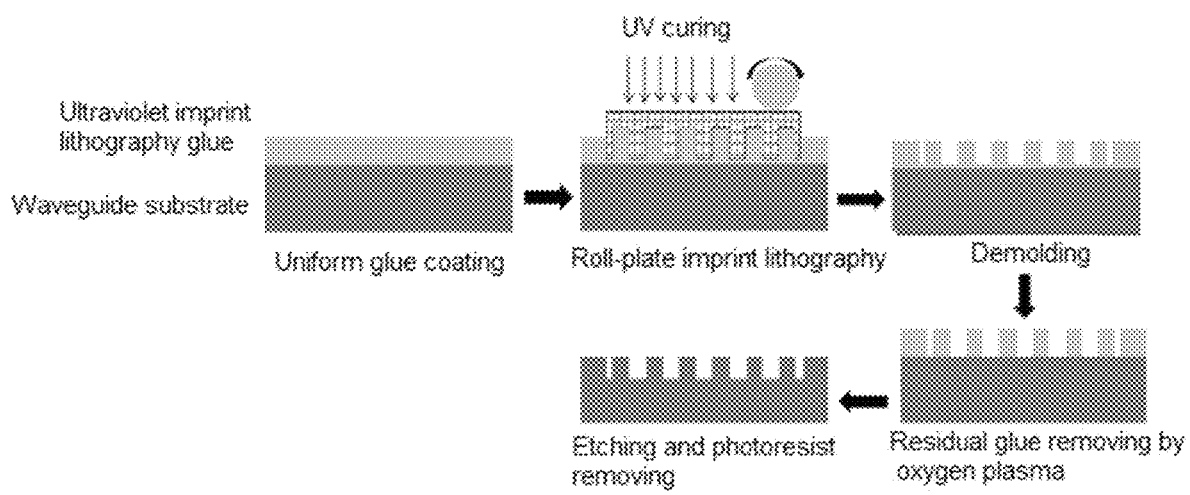
FIG. 5 illustrates another flow diagram for manufacturing a diffraction grating waveguide on the basis of nano-imprint lithography in the manufacturing method for a diffraction grating waveguide of a near-eye display of some embodiments of the present disclosure.
Figure 6:
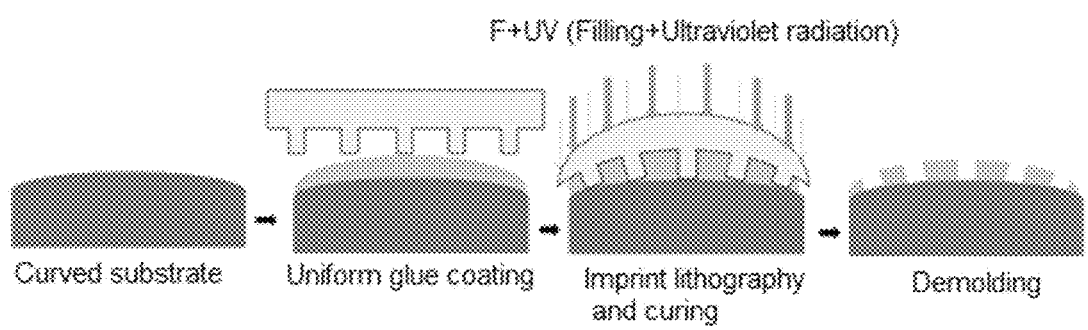
FIG. 6 illustrates a flow diagram for manufacturing a diffraction grating waveguide on a curved substrate by a flexible template in the manufacturing method for a diffraction grating waveguide of a near-eye display of some embodiments of the present disclosure.

In order to further improve a display effect, after curing and demolding, the above step may further include: transfer, by an etching process, the diffraction grating waveguide pattern on the ultraviolet imprint lithography glue to the waveguide substrate, and remove the ultraviolet imprint lithography glue, so as to obtain the diffraction grating waveguide of the eye display with a better display effect, and further improve a temperature range, a field angle, resolution and definition of the diffraction grating waveguide, with reference to FIG. 5. Specific etching conditions are as follows: a pressure is 0.3-0.5 Pa, etching inductively coupled plasma (ICP) power is 380-410 w, bias power is 45-56 w, $CFH_3$ flow is 38-44 sccm, Ar flow is 12-16 sccm, $O_2$ flow is 4-6 sccm, and etching time is 160-195 s.

In order to obtain the diffraction grating waveguide of the near-eye display with a wide field of view (FOV), a glass substrate with a high refractive index (the refractive index being greater than 1.8) is used as the waveguide substrate, and a ultraviolet photoresist with a high refractive index (the refractive index being greater than 1.7) is used, and the cured ultraviolet photoresist has a relatively high use environment temperature such that different use environments of the diffraction grating waveguide of the near-eye display is met.

It is worth noting that in order to manufacture a near-eye display which is more ergonomic, when the transferring template is a flexible template, a curved substrate may be used as a waveguide substrate, and a diffraction grating waveguide, such as a near-eye lens with a radian, of the near-eye display may be manufactured on the curved substrate. A specific process flow of manufacturing the diffraction grating waveguide of the near-eye display on the curved substrate by the flexible template includes: provide a curved substrate as a waveguide substrate, uniformly cover, with a 1.8-2.3 μm of ultraviolet imprint lithography glue by slit scraping coating, a side, facing a transferring template, of the curved substrate, cover, with the transferring template, the curved substrate coated with the ultraviolet imprint lithography glue, and apply a pressure of 0.2-0.5 MPa by pneumatic uniform pressurization or rolling pressurization, so as to fill a reverse pattern of a diffraction grating waveguide pattern of the transferring template with the ultraviolet imprint lithography glue, and cure the ultraviolet imprint lithography glue by ultraviolet irradiation for 22-28 s and demold to obtain the diffraction grating waveguide of the near-eye display. In order to guarantee an optical performance, a grating structure with a variable period is designed, and when the flexible template is bent and attached to the curved substrate, the period of the grating changes by bending of the flexible template, so as to obtain the curved diffraction grating waveguide of the near-eye display meeting the optical performance.

Figure 7:
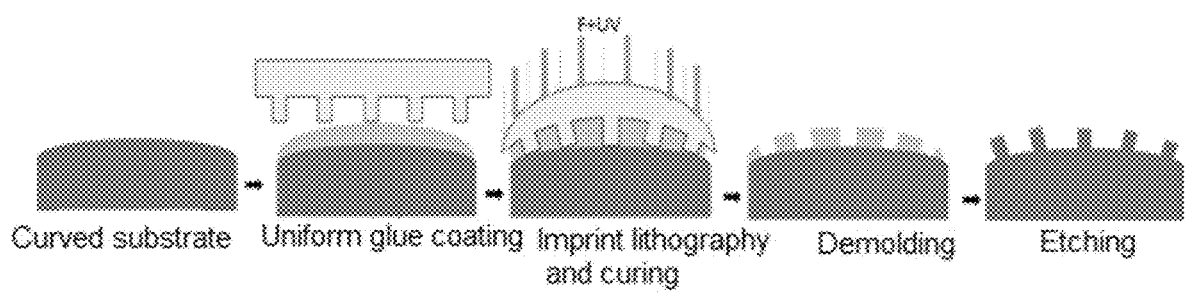
FIG. 7 illustrates another flow diagram for manufacturing a diffraction grating waveguide on a curved substrate by a flexible template in the manufacturing method for a diffraction grating waveguide of a near-eye display of some embodiments of the present disclosure.

In order to further improve the performance, such as the use temperature range, the field angle, the resolution and the definition, of the near-eye display, step 3 further includes: after curing and demolding, transfer the diffraction waveguide pattern on the ultraviolet imprint lithography glue to the curved substrate by an etching process, and remove the ultraviolet imprint lithography glue. As shown in FIG. 7, etching conditions are as follows: a pressure is 0.5 Pa, etching ICP power is 500 w, bias power is 30 w, $CFH_3$ flow is 42 sccm, Ar flow is 15 sccm, $O_2$ flow is 5 sccm, and etching time is 200 s.

In order to obtain a light, corrosion-resistant and crack-resistant diffraction grating waveguide of the near-eye display, in step 3, a transparent polymer substrate (such as modified transparent thermoplastic polymer PMMA and PET) with a high refractive index (being greater than 1.75) is used as the waveguide substrate.

Figure 8:
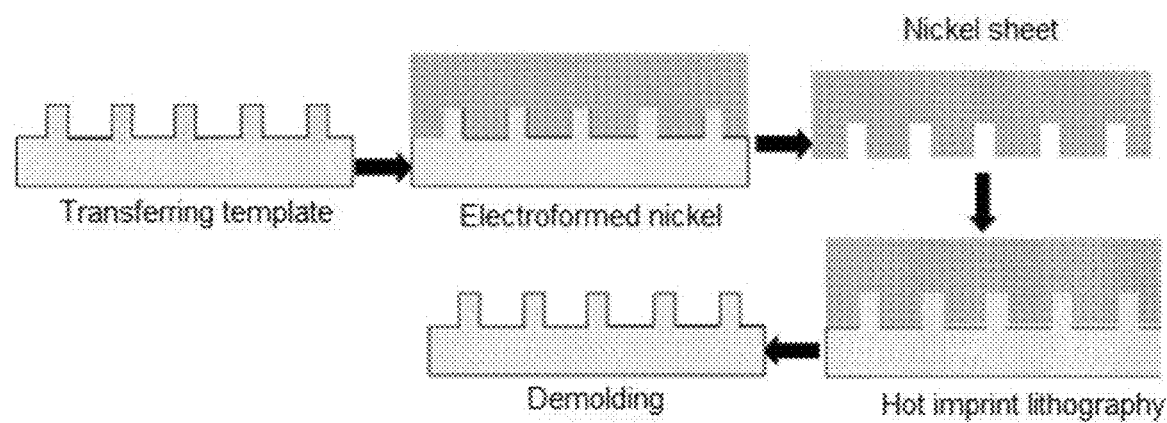
FIG. 8 illustrates a flow diagram for manufacturing a light polymer-based diffraction grating waveguide by hot imprint lithography in the manufacturing method for a diffraction grating waveguide of a near-eye display of some embodiments of the present disclosure.

A process for manufacturing the diffraction grating waveguide by the transparent polymer substrate is shown in FIG. 8: make the waveguide substrate by modified PMMA, transfer the pattern on the transferring template to a nickel sheet by electroforming, and carry out hot imprint lithography by the nickel sheet. Specifically, a nickel seed layer is deposited on the transferring template by electron beam evaporation coating, etc., an evaporation material is nickel particles of 3-6 N, a pressure of a deposition chamber is $4.5$-$5.6\times10^{-4}$ pa by pumping, an electron beam current is 38-45 mA, an evaporation rate is 0.1-0.4 a/s, and a thickness is 85-150 nm. It should be noted that the nickel seed layer is also deposited by atomic layer deposition or magnetron sputtering, nickel sulfamate is used as electroforming solution for electroforming, an electroforming temperature is 43-46° C., current density is 3.8-4.4 $A/dm^2$, and time is 2.5-3.7 h. An electroformed nickel sheet is placed on the waveguide substrate, heating is carried out to 120-140° C., an imprint lithography pressure is 5.5-6.7 MPa, pressure maintaining time is 8-11 min, then cooling is carried out to 63-69° C., and demolding is carried out to obtain the modified PMMA based diffraction grating waveguide of the near-eye display.

The foregoing description, merely optimal embodiments of the disclosure, is not intended to limit the scope of protection of the disclosure, and any changes or substitutions, that may readily occur to those skilled in the art, within the scope of technology disclosed in the disclosure are intended to fall within the scope of protection of the disclosure.

What is claimed is:

1. A manufacturing method for a diffraction grating waveguide of a near-eye display, comprising:
   step 1: manufacturing an imprint lithography template with a diffraction grating waveguide pattern;
   step 2: transferring the diffraction grating waveguide pattern of the imprint lithography template to a transferring template by nano-imprint lithography, so as to obtain a transferring template with a reverse pattern of the diffraction grating waveguide pattern; and
   step 3: transferring the reverse pattern of the diffraction grating waveguide pattern of the transferring template to a waveguide substrate by nano-imprint lithography, so as to obtain the diffraction grating waveguide of the near-eye display;
   wherein the transferring template is a flexible template, and the waveguide substrate is a curved substrate, when the flexible template is bent and attached to the curved substrate, a period of a grating of the diffraction grating waveguide of the near-eye display changes by bending of the flexible template;
   wherein the waveguide substrate is a glass substrate with a refractive index greater than 1.8;
   wherein transferring the reverse pattern of the diffraction grating waveguide pattern of the transferring template to a waveguide substrate by nano-imprint lithography comprises: transferring the reverse pattern of the diffraction grating waveguide pattern of the transferring template to the waveguide substrate by ultraviolet imprint lithography, and a refractive index of an ultraviolet imprint lithography glue used in the ultraviolet imprint lithography is greater than 1.7.

2. The manufacturing method for the diffraction grating waveguide of the near-eye display as claimed in claim 1, wherein the step 1 comprises: providing an imprint lithography substrate, and uniformly spin-coating the imprint lithography substrate with a photoresist; baking to remove a photoresist solvent in the photoresist, and exposing a photoresist layer by an exposure process until a surface of the imprint lithography substrate is exposed, so as to form the diffraction grating waveguide pattern on the photoresist layer after development; etching the imprint lithography substrate after being exposed by an etching process, and transferring the diffraction grating waveguide pattern from the photoresist layer to the imprint lithography substrate, so as to form the diffraction grating waveguide pattern on the imprint lithography substrate; and removing the photoresist layer to obtain the imprint lithography template with the diffraction grating waveguide pattern.

3. The manufacturing method for a diffraction grating waveguide of a near-eye display as claimed in claim 2, wherein in the step 3, the nano-imprint lithography is hot imprint lithography or ultraviolet imprint lithography.

4. The manufacturing method for a diffraction grating waveguide of a near-eye display as claimed in claim 1, wherein in the step 2, the nano-imprint lithography is hot imprint lithography or ultraviolet imprint lithography.

5. The manufacturing method for a diffraction grating waveguide of a near-eye display as claimed in claim 4, wherein transferring the diffraction grating waveguide pattern of the imprint lithography template to the transferring template by the hot imprint lithography comprises: placing a flexible substrate on a surface, with the diffraction grating waveguide pattern, of the imprint lithography template; heating the flexible substrate to a glass transition temperature or above; applying a pressure to soften the flexible substrate and fill the diffraction grating waveguide pattern of the imprint lithography template with the flexible substrate; and carrying out cooling and demolding to obtain the transferring template with the reverse pattern of the diffraction grating waveguide pattern.

6. The manufacturing method for a diffraction grating waveguide of a near-eye display as claimed in claim 5, wherein in the step 3, the nano-imprint lithography is hot imprint lithography or ultraviolet imprint lithography.

7. The manufacturing method for the diffraction grating waveguide of the near-eye display as claimed in claim 4, wherein transferring the diffraction grating waveguide pattern of the imprint lithography template to the transferring template by the ultraviolet imprint lithography comprises: providing a transparent flexible substrate; spin-coating with an ultraviolet sensitive glue on a side, facing the imprint lithography template, of the transparent flexible substrate; attaching the transparent flexible substrate to the imprint lithography template; applying a pressure to fill the diffraction grating waveguide pattern of the imprint lithography template with the ultraviolet sensitive glue; and curing the ultraviolet sensitive glue and demolding to obtain the transferring template with a reverse pattern of the diffraction grating waveguide pattern.

8. The manufacturing method for a diffraction grating waveguide of a near-eye display as claimed in claim 7, wherein in the step 3, the nano-imprint lithography is hot imprint lithography or ultraviolet imprint lithography.

9. The manufacturing method for a diffraction grating waveguide of a near-eye display as claimed in claim 4, wherein in the step 3, the nano-imprint lithography is hot imprint lithography or ultraviolet imprint lithography.

10. The manufacturing method for a diffraction grating waveguide of a near-eye display as claimed in claim 1, wherein in the step 3, the nano-imprint lithography is hot imprint lithography or ultraviolet imprint lithography.

11. The manufacturing method for a diffraction grating waveguide of a near-eye display as claimed in claim 10, wherein transferring the reverse pattern of the diffraction grating waveguide pattern of the transferring template to the waveguide substrate by the ultraviolet imprint lithography comprises: providing the waveguide substrate; spin-coating with an ultraviolet imprint lithography glue on a side, facing the transferring template, of the waveguide substrate; covering the transferring template on the waveguide substrate coated with the ultraviolet imprint lithography glue; filling the ultraviolet imprint lithography glue in the reverse pattern of the diffraction grating waveguide pattern of the transferring template by pneumatic uniform pressurization or rolling pressurization; and curing the ultraviolet imprint lithography glue and demolding to obtain the diffraction grating waveguide of the near-eye display.

12. The manufacturing method for the diffraction grating waveguide of the near-eye display as claimed in claim 11, wherein the step 3 further comprises: after curing and demolding, transferring the diffraction grating waveguide pattern on the ultraviolet imprint lithography glue to the waveguide substrate by etching, so as to remove the ultraviolet imprint lithography glue.

13. The manufacturing method for the diffraction grating waveguide of the near-eye display as claimed in claim 1, wherein in the step 3, the waveguide substrate is a transparent polymer substrate; and the step 3 comprises: transferring the reverse pattern of the diffraction grating waveguide pattern on the transferring template to a nickel sheet by electroforming; placing the nickel sheet after being electroformed on the transparent polymer substrate; enabling the transparent polymer substrate to enter the diffraction grating waveguide pattern of the nickel sheet by hot imprint lithography; and carrying out cooling and demolding to obtain the diffraction grating waveguide of the near-eye display.

\* \* \* \* \*